United States Patent
Zhang et al.

(10) Patent No.: US 12,018,361 B2
(45) Date of Patent: Jun. 25, 2024

(54) WAVEFORM SHAPE FACTOR FOR PULSED PVD POWER

(71) Applicant: Applied Materials, Inc., Santa Clara, CA (US)

(72) Inventors: Shouyin Zhang, Livermore, CA (US); Keith A. Miller, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 204 days.

(21) Appl. No.: 17/858,592

(22) Filed: Jul. 6, 2022

(65) Prior Publication Data

US 2022/0356559 A1 Nov. 10, 2022

Related U.S. Application Data

(63) Continuation of application No. 17/535,638, filed on Nov. 25, 2021.

(60) Provisional application No. 63/147,215, filed on Feb. 8, 2021, provisional application No. 63/118,158, filed on Nov. 25, 2020.

(51) Int. Cl.
  C23C 14/54 (2006.01)
  C23C 14/28 (2006.01)
  H01J 37/32 (2006.01)
  H05H 1/00 (2006.01)

(52) U.S. Cl.
  CPC ............ *C23C 14/54* (2013.01); *C23C 14/28* (2013.01); *H01J 37/32917* (2013.01); *H05H 1/0081* (2013.01); *H05H 2242/20* (2021.05)

(58) Field of Classification Search
  CPC ............ H01J 37/32146; H01J 37/3467; H01J 37/32917; C23C 14/54; C23C 14/28; H05H 1/0081; H05H 2242/20
  USPC ............................................ 361/1
  See application file for complete search history.

(56) References Cited

U.S. PATENT DOCUMENTS

| 2002/0029851 | A1* | 3/2002 | Edamura | H01J 37/32935 118/723 R |
| 2009/0184819 | A1 | 7/2009 | Green | |
| 2010/0163182 | A1* | 7/2010 | Mizukami | H01J 37/32935 156/345.26 |
| 2014/0152189 | A1* | 6/2014 | Gilmore | H01J 37/32183 315/224 |
| 2015/0279624 | A1* | 10/2015 | Toyota | H01J 37/32192 156/345.28 |

(Continued)

FOREIGN PATENT DOCUMENTS

| JP | 2009048880 A | 3/2009 |
| KR | 20120059561 A | 6/2012 |

OTHER PUBLICATIONS

Final Office Action in U.S. Appl. No. 17/535,638 dated Sep. 20, 2023, 9 pages.

(Continued)

*Primary Examiner* — Kevin J Comber
(74) *Attorney, Agent, or Firm* — Servilla Whitney LLC

(57) ABSTRACT

Power supplies, waveform function generators and methods for controlling a plasma process are described. The power supplies or waveform function generators include a component for executing the method in which a waveform shape change index is determined during a plasma process and evaluated for compliance with a predetermined tolerance.

9 Claims, 3 Drawing Sheets

(56) References Cited

U.S. PATENT DOCUMENTS

2016/0268108 A1* 9/2016 Daniels ............ H01J 37/32935

OTHER PUBLICATIONS

PCT International Search Report and Written Opinion in PCT/US2021/060723 dated Mar. 17, 2022, 10 pages.

* cited by examiner

WAVEFORM SHAPE FACTOR FOR PULSED PVD POWER

CROSS-REFERENCE TO RELATED APPLICATIONS

This application is a Continuation of U.S. patent application Ser. No. 17/535,638, filed Nov. 25, 2021, which claims priority to U.S. Provisional Application No. 63/147,215, filed Feb. 8, 2021, and U.S. Provisional Application No. 63/118,158, filed Nov. 25, 2020, the entire disclosures of which are hereby incorporated by reference herein.

TECHNICAL FIELD

Embodiments of the disclosure generally relate to physical vapor deposition (PVD) chambers and methods. In particular, embodiments of disclosure relate to PVD chambers and deposition methods using pulsed PVD with a controller power waveform.

BACKGROUND

Current physical vapor deposition (PVD) process chambers are susceptible to decreased uniformity and repeatability as power regulation changes. Power regulation is typically used in driving pulsed PVD plasma chambers with certain shapes of voltage/current waveforms. Such voltage/current waveforms are designed to achieve certain film characteristics or properties.

The same averaged power, voltage or current can be delivered within a pulse with different waveforms shapes, as shown in FIG. 1. The different shaped waveforms correspond to different plasma properties in the PVD chamber. The power/voltage/current waveform shapes drift or dramatically change due to chamber load conditions, plasma instabilities, chamber plasma arcing or load changes, and sometimes due to the malfunctions of the power supply as well as the power delivery output cable hardware malfunctions. These waveform shape changes impact the thin film properties due to the chamber plasma conditions changing.

Accordingly, there is a need for apparatus and methods to detect/increase/ensure pulsed PVD chamber deposition film performances if power/voltage/current waveforms changes.

SUMMARY

One or more embodiments of the disclosure are directed to methods for controlling a plasma process. The methods comprise determining a waveform shape change index during the deposition process; determining if the waveform shape index is within a predetermined tolerance; and determining a subsequent action for the plasma process.

Additional embodiments of the disclosure are directed to methods of matching a plasma process to a reference plasma process. The methods comprise determining a waveform shape factor $\overline{S}_t$ during the plasma process; determining a waveform shape change index $I_s$ using the waveform shape factor $\overline{S}_t$ and an average reference waveform shape factor $\overline{S}_0$ from the reference plasma process; determining whether the plasma process matches the reference plasma process based on the waveform shape index $I_s$.

Further embodiments of the disclosure are directed to power supplies comprising a self-diagnostic function that indicates a malfunction. The self-diagnostic function comprises a controller configured to determine one or more of a waveform shape factor $\overline{S}$ or waveform shape change index $I_s$.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
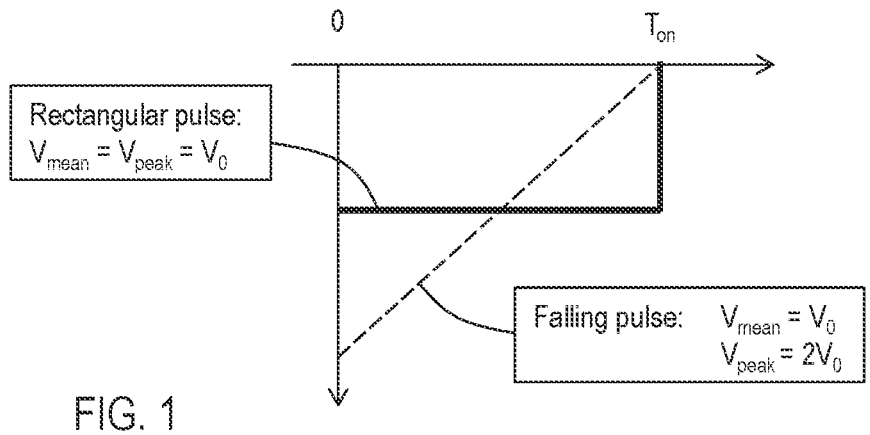
FIG. 1 shows waveform shapes according to one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

One or more embodiments of the disclosure provide apparatus and/or methods of quantifying waveform distortions/changes from the predetermined or default waveform shape during chamber operation. In some embodiments, the predetermined or default waveform shape provides a known plasma performance for a film with specific properties. The default or predetermined waveform in some embodiments is stored as a best known method (BKM) on a PVD chamber configuration.

In some embodiments, a waveform shape factor is calculated based on measurements from hardware and/or firmware inside the power supply. In some embodiments, the delivered voltage and/or current are sampled externally and the waveform shape factor is calculated in real-time by external computer(s) that taking data/communications from the sensors.

The waveform factor of some embodiments is used to measure process chamber performance over time. In some embodiments, the real-time measured waveform factor is compared to the stored BKM waveform factor to evaluate PVD chamber performance. The real-time measured waveform factor comparison of some embodiments indicates whether the system has drifted or changed or may suffer chamber matching issues that may affect chamber performance. In some embodiments, the waveform factor of a process chamber is compared to a stored waveform factor of a reference or "golden" chamber to allow chamber matching.

Referring to FIG. 1, a rectangular shaped voltage waveform (solid bold line) and triangular shaped waveform (dashed line) is illustrated as an example. The mean voltage/average voltage during the pulse from both waveforms are the same, as illustrated in Equations (I) and (II). The overall shapes of the pulses differ with the falling triangular pulse having a maximum voltage ($V_{peak}$) twice that of the rectangular waveform. While the examples below discuss the voltage values for the waveforms, the skilled artisan will recognize that these values could be indicative of the waveform power or current.

$$\text{Rectangular Shape: } V_{mean} = \frac{V_0 \times T_{on}}{T_{on}} = V_0 \quad \text{(I)}$$

$$\text{Falling Triangle Shape: } V_{mean} = \left(\frac{1}{2}\right) \times \frac{2V_0 \times T_{on}}{T_{on}} = V_0 \quad \text{(II)}$$

Figure 2A:
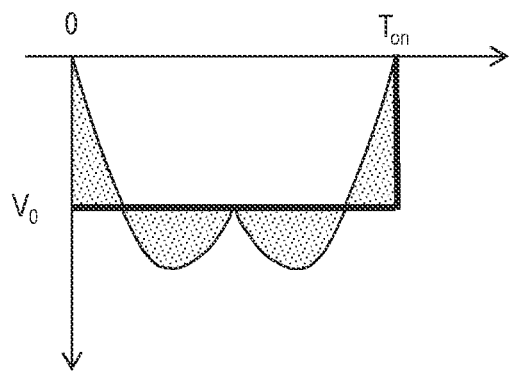
FIGS. 2A through 2D show waveform shapes according to one or more embodiment of the disclosure.
Figure 2B:
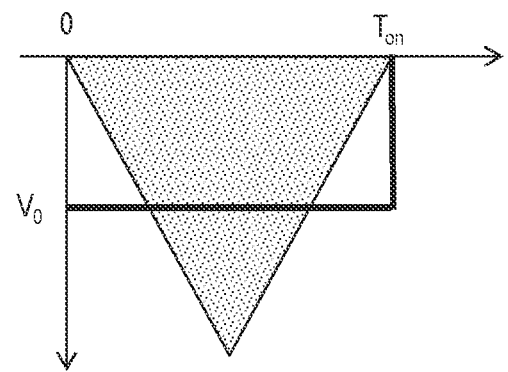
Figure 2C:
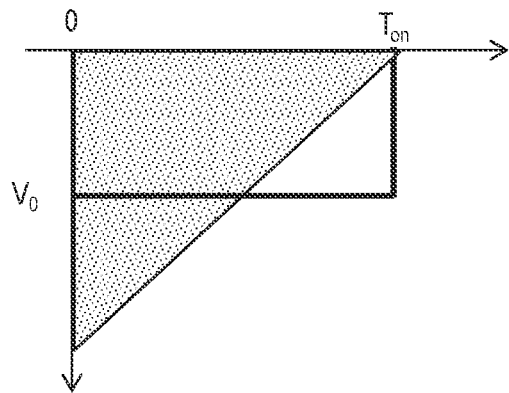
Figure 2D:
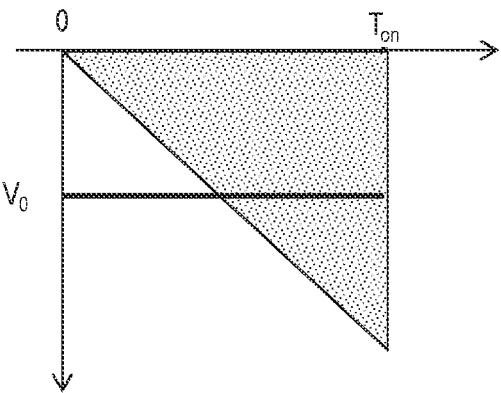

FIGS. 2A, 2B and 2D illustrate other waveform shapes. FIG. 2C illustrates the falling triangle shape shown in FIG. 1 for comparison purposes. In FIG. 2A, when the shaded area of the 'W' shaped area below the $V_0$ line is equal to the shaded area above the $V_0$ line, the average value is equal to $V_0$. In FIG. 2B, when the peak of the triangle is equal to two times the $V_0$ value, the average value is equal to $V_0$. FIG. 2C shows the same shape falling triangle as that of FIG. 1 where the peak value is twice $V_0$ and the average value is equal to $V_0$. FIG. 2D illustrates another falling triangle shape opposite that of FIG. 2C in which the peak value is twice $V_0$ and the average value is equal to $V_0$. Each of the different waveforms illustrated in FIGS. 2A through 2D have the same average value ($V_{mean}$) which is equal to $V_0$ of the rectangular signal. However, each of the waveform shapes is different.

To evaluate the difference in waveforms having the same mean voltage, a waveform shape factor (S) can be determined using Equation (III) and an average waveform shape factor ($S_{avg}$ or $\overline{S}$) can be determined using Equation (IV).

$$S(t) = \left(\frac{v(t) - v_{mean}}{v_{mean}}\right)^2 \quad \text{(III)}$$

where v(t) is the measured real-time voltage; and $v_{mean}$ is either the moving average value through real-time measurement or a given value pre-determined by software, firmware or user.

$$\overline{S}_{T_{on}} = \frac{\int_0^{T_{on}} S(t)dt}{\int_0^{T_{on}} dt} \quad \text{(IV)}$$

Applying equations (III) and (IV), the rectangular waveform pattern illustrated in FIG. 1 would have a theoretical average waveform shape factor $\overline{S}$ of 0. However, the skilled artisan will recognize that the average waveform factor will likely deviate from the theoretical value due to actual measurements and data processing variations. For example, signal-to-noise (SNR) variations may affect the actual average waveform factor calculation.

The embodiments illustrated in FIGS. 2C and 2D, while appearing as mirror images of each other, have different average waveform factors $\overline{S}$. The average waveform factors of FIGS. 2C and 2D are 76/3 and 1/3, respectively. The skilled artisan will recognize that the average waveform factor is indicative of the different waveforms.

Figure 3:
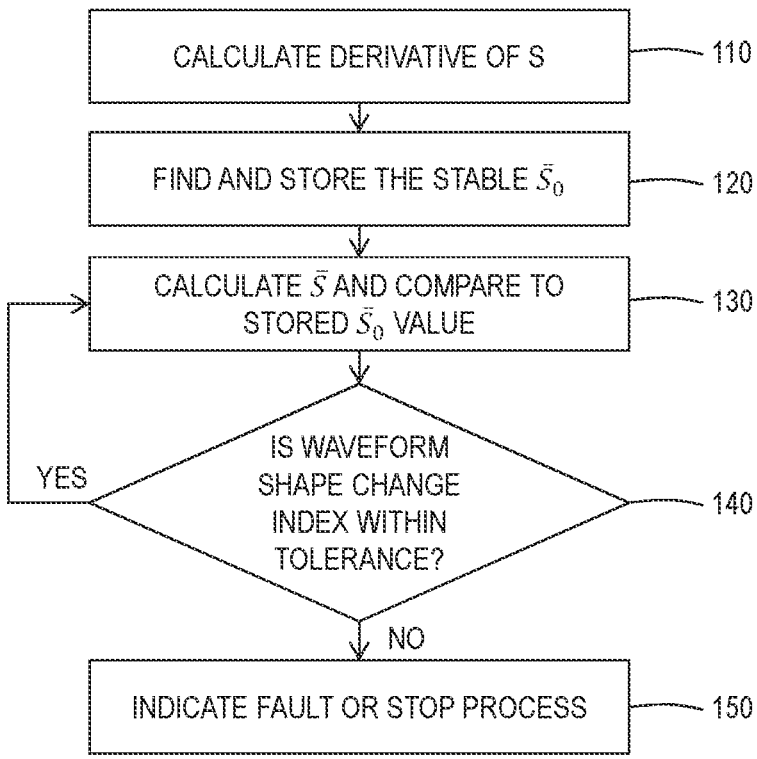
FIG. 3 shows a method according to one or more embodiment of the disclosure.

FIG. 3 shows a method 100 in accordance with one or more embodiment of the disclosure. The method 100 of some embodiments can be used to evaluate plasma processing chamber performance drift due to plasma impedance changes caused by arcing and/or plasma instabilities. The methods described herein often refer to the process as a physical vapor deposition or PVD process. However, the skilled artisan will recognize that the methods are applicable to any plasma process and the disclosure is not limited to physical vapor deposition processes. In some embodiments, the method is used to address other commonly seen waveform shapes including other forms of triangle shapes, sinusoidal shapes or enveloped (modulated) shapes containing multiple primary frequencies and amplitudes, not illustrated here. Some embodiments of the disclosure are used with semiconductor PVD processing. Some embodiments are used with complicated power delivery into other industry loads, like plasma etch processing, scientific laboratory waveform function generators, RADAR launching, industry inductive heating.

During the primary plasma power deposition, at process 110, the derivative of the waveform shape factor $\overline{S}$ is determined according to Equation (IV) while the power delivered to the plasma chamber is pulsed. At process 120, a stable waveform shape factor $\overline{S}_0$ is determined and stored. The stable waveform shape factor is determined when the derivative of the waveform shape factor $\overline{S}$ is near 0. The stable waveform shape factor $\overline{S}_0$ of some embodiments is stored in memory or firmware of a process chamber, processing tool software, a process control server or a mobile app or inside the power supply itself.

In some embodiments, the stable waveform shape factor $\overline{S}_0$ is preset or loaded into the system controller. For example, in a chamber matching process, the stable waveform shape factor of some embodiments is determined by the "golden" chamber or reference process. The preset stable waveform shape factor represents a specific pulse shape defined/developed for a specific plasma process or specific process chamber.

In process 130, the waveform shape factor $\overline{S}$ is continually calculated during plasma processing. The determined waveform shape factor determined at any time t ($\overline{S}_t$) is compared to the stable waveform shape factor $\overline{S}_0$ stored in process 120. In some embodiments, a waveform shape change index $I_s$ is calculated using Equation (V).

In addition to the waveform shape factor $\overline{S}$ defined in Equation (III) and (IV), in some embodiments, other waveform or pulsing characteristics are built into a more complex factor formula. For example, in some embodiments, pulse frequency(ies) F and the deviation ($\Delta F$) of F from the requested value $F_0$, pulse on/off duty cycles (DT) and deviation of the requested DT, output power P and the deviation of P from the requested power $P_0$, phase angle $\varphi$/phase angle change $\Delta \varphi$. In some embodiments, any or all of the parameters are measured internally or externally by sensors. In some embodiments, the measured variables are weighted (through coefficient K, a multiplier) and added into the $\overline{S}_{cup}$ (supplementary), to form a comprehensive factor to indicate a wide picture of the quality and characteristics of the delivered waveforms. Equation (III) may evolve into Equation (V).

$$S(t) = S_{init} + K_v \left( \frac{v(t) - v_{mean}}{v_{mean}} \right)^2 + \\ K_f * \left| \frac{\Delta F(t)}{F_0} \right| + K_{DT} * \left| \frac{\Delta DT(t)}{DT_0} \right| + K_p * \left| \frac{\Delta P(t)}{P_0} \right| + \ldots \quad (V)$$

The last unspecified term (+ . . . ) refers to any additional parameters added to Equation (V) depending on the particular process conditions and hardware used. For example, secondary frequencies, powers, phase angles, etc.

$\Delta F(t) = F(t) - F_0$, where F(t) is the measured real-time frequency, $F_0$ is a moving average of the measured frequency or the predetermined input frequency per the application. $\Delta DT(t) = DT(t) - DT_0$, where DT(t) is the measured real-time duty cycle, $DT_0$ is either a moving average value or a predetermined value per the application. $\Delta P(t) = P(t) - P_0$, where P(t) is the measured real-time power and $P_0$ is either a moving average value or a predetermined value per the application.

$S_{init} \geq 0$, a fixed chosen real number for a specific application, used to offset baseline if necessary; can be set to 0 or a small number (e.g., 10% or less) relative to the magnitude of the subtotal contributions in the equation. The >0 value may also help tuning the sensitivity of the S(t) signal monitoring. In some embodiments, higher relative value to the rest items' subtotal contributions decreases monitoring sensitivity.

Equation (V) can also be split into equations (V') and (V'').

$$S(t) = S_{init} + K_v \left( \frac{v(t) - v_{mean}}{v_{mean}} \right)^2 + S_{sup} \quad (V')$$

$$S_{sup} = K_f * \left| \frac{\Delta F(t)}{F_0} \right| + K_{DT} * \left| \frac{\Delta DT(t)}{DT_0} \right| + K_p * \left| \frac{\Delta P(t)}{P_0} \right| + \ldots \quad (V'')$$

where K is 0 or other real numbers to indicate the weight of the effect of the parameter change. When $K_f$, $K_{dt}$, or $K_p$ all set to 0, and $K_v = 1$, and Equation (V') reduces to the basic format of Equation (III).

$$I_S = \left| \frac{\overline{S}_t - \overline{S}_0}{\overline{S}_0} \right| \times 100\% \quad (VI)$$

At decision point 140, the waveform shape factor index $I_s$ is evaluated to determine if the value is within a predetermined tolerance value for the process or process chamber. If the waveform shape factor index $I_s$ is within tolerance, the method 100 continues at process 130 with the continuing determination of the waveform shape factor $\overline{S}$. If the waveform shape factor index Is is outside of the predetermined tolerance, the method of some embodiments, at process 150, alerts the user to the existence of a fault or tolerance failure and/or automatically stops of the plasma process.

In the method illustrated in FIG. 3, the first two processes 110, 120 are determined using the same process chamber and/or plasma process as the remainder of the method 100. A method of this sort monitors the process chamber and/or plasma process for deviations over time to ensure stable operation of the chamber.

Figure 4:
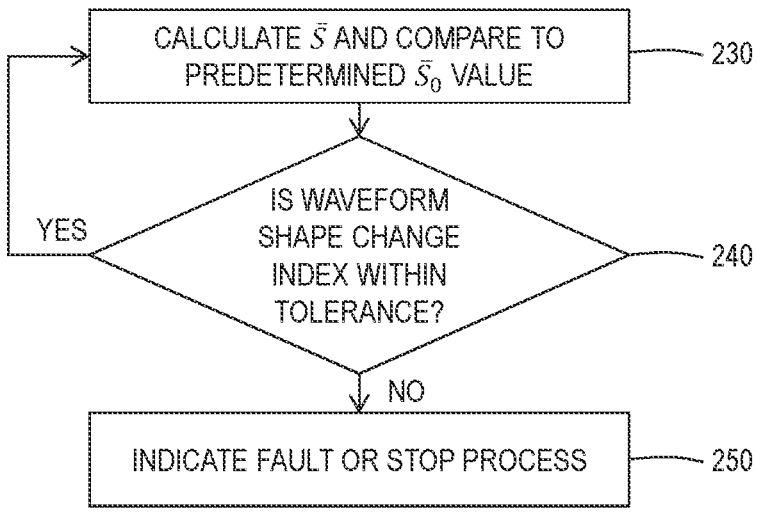
FIG. 4 shows a method according to one or more embodiment of the disclosure.

FIG. 4 shows another embodiment in which method 200 is used for chamber matching. At process 230, the waveform shape factor $\overline{S}$ is determined and compared to a predetermined waveform shape factor $\overline{S}_0$ from a reference or "golden" chamber. The reference chamber of some embodiments comprises the process chamber hardware, process equipment manufacturer and/or the processing method.

At process 240, the calculated waveform shape change index $I_s$ is compared to a predetermined tolerance. If the waveform shape change index $I_s$ is greater than or outside of the tolerance, a fault message is generated and/or the plasma process is stopped, at process 250. The waveform shape change index falling outside of the tolerance indicates that the chamber or plasma process does not match the reference or "golden" chamber of process.

In some embodiments, the waveform shape change index $I_s$ is based on the shape factor calculation and is used for in-situ process control to identify wafers that may have experienced issued caused by power supply malfunction or chamber hardware failure and/or performance drift that caused plasma load changes.

In some embodiments, the waveform shape factor $\overline{S}$ and/or the waveform shape change index $I_s$ is incorporated into power supply or waveform function generators to ensure power supply or waveform generator outputs a waveform shape relative to a predetermined or default shape. In some embodiments, incorporating a waveform shape factor $\overline{S}$ and/or waveform shape change index $I_s$ measurement into the power supply or waveform function generator provides control of the waveform shape without additional measurement, sampling and/or monitoring of the waveform output by external sensing probes (sensors)/computers.

Figure 5:
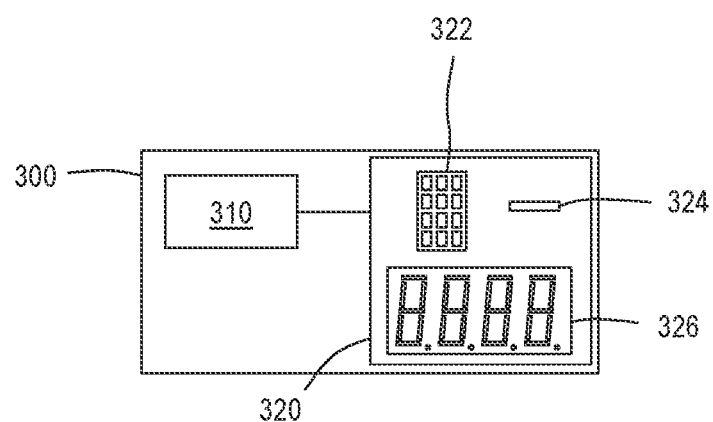
FIG. 5 shows a power supply according to one or more embodiment of the disclosure.

In some embodiments, a waveform shape factor $\overline{S}$ and/or waveform shape change index $I_s$ measurement system is incorporated into the power supply (or waveform function generator) to provide a self-diagnostic function that indicates malfunction of the instrument. Accordingly, some embodiment of the disclosure, as shown in FIG. 5, are directed to power supplies 300 (or waveform function generators) incorporating a controller 310 configured to determine one or more of the waveform shape factor $\overline{S}$ or waveform shape change index $I_s$ in real-time. As used herein, the term "power supply" includes both traditional power supply modules and waveform function generators. In some embodiments, the power supply 300 includes an input/output (I/O) 320 to accept user input and provide feedback. The I/O 320 of some embodiments comprises a suitable component to allow the user to enter a predetermined waveform shape factor or waveform shape change index. The data entry component can be any suitable component known the skilled artisan including, but not limited to, keypads 322 or memory card readers 324. In some embodiments, the I/O 320 includes a display 326 connected to the controller 310 and the controller 310 is configured to output the measured waveform shape factor or waveform shape change index to the display in real-time, or in predetermined time increments.

The controller 310 may be one of any form of general-purpose computer processor, microcontroller, microprocessor, etc., that can be used in an industrial setting. In some embodiments, there is at least one controller 310. The at least one controller 310 can have a processor, a memory coupled to the processor, input/output devices 320 coupled to the processor, and support circuits to communication between the different electronic components. The memory can include one or more of transitory memory (e.g., random access memory) and non-transitory memory (e.g., storage).

The memory, or computer-readable medium, of the processor may be one or more of readily available memory such as random access memory (RAM), read-only memory (ROM), floppy disk, hard disk, or any other form of digital storage, local or remote. The memory can retain an instruction set that is operable by the processor to control parameters and components of the system. The support circuits are coupled to the processor for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller has one or more configurations to execute individual processes or sub-processes to perform the method. The controller can be connected to and configured to operate intermediate components to perform the functions of the methods. For example, the controller can be connected to and configured to control power or frequency of the power source.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A power supply comprising a self-diagnostic function that indicates a malfunction, the self-diagnostic function comprising a controller configured to determine a waveform shape change index $I_s$ in real-time using Equation (VI), $$I_S = \left|\frac{\overline{S}_t - \overline{S}_0}{\overline{S}_0}\right| \times 100\%, \tag{VI}$$

where $\overline{S}_t$ is the average waveform shape factor, $\overline{S}_0$ is an average reference waveform shape factor.

2. The power supply of claim 1, wherein the controller is further configured to determine a waveform shape factor S(t) at time t is calculated using equation (III) or equation (V)

$$S(t) = \left(\frac{v_t - v_{mean}}{v_{mean}}\right)^2 \tag{III}$$

$$S(t) = S_{init} + K_v\left(\frac{v(t) - v_{mean}}{v_{mean}}\right)^2 + \tag{V}$$
$$K_f * \left|\frac{\Delta F(t)}{F_0}\right| + K_{DT} * \left|\frac{\Delta DT(t)}{DT_0}\right| + K_p * \left|\frac{\Delta P(t)}{P_0}\right|.$$

3. The power supply of claim 2, wherein the power supply further comprises one or more input/output to accept user input and/or provide user feedback reporting one or more of a measured waveform shape factor or waveform shape change index.

4. The power supply of claim 2, wherein the average waveform shape factor $\overline{S}_t$ is calculated using equation (IV)

$$\overline{S}_t = \frac{\int_0^{T_{on}} S(t)dt}{\int_0^{T_{on}} dt}, \tag{IV}$$

where the integral is a pulse length from time 0 to time $T_{on}$ and S(t) is the waveform shape factor.

5. The power supply of claim 4 wherein the average reference waveform shape factor is determined from a first pulse of power in the plasma process.

6. The power supply of claim 5, wherein the waveform shape factor index is a monitor of the process chamber and/or plasma process for deviations over time to ensure stable operation of the chamber.

7. The power supply of claim 4 wherein the average reference waveform shape factor is determined from a reference plasma process or reference processing chamber.

8. The power supply of claim 7, wherein the waveform shape factor index matches a subject plasma process or processing chamber to the reference plasma process or reference processing chamber, respectively.

9. The power supply of claim 4, wherein if the waveform shape change index is outside of the predetermined tolerance, the controller is further configured to alert a user to existence of a fault or tolerance failure, or automatically stopping of the plasma process.

* * * * *

UNITED STATES PATENT AND TRADEMARK OFFICE
CERTIFICATE OF CORRECTION

| | |
|---|---|
| PATENT NO. | : 12,018,361 B2 |
| APPLICATION NO. | : 17/858592 |
| DATED | : June 25, 2024 |
| INVENTOR(S) | : Shouyin Zhang et al. |

It is certified that error appears in the above-identified patent and that said Letters Patent is hereby corrected as shown below:

In the Specification

•Column 5, Line 22, replace "$S_{cup}$" after "the" and before "(supplementary), to form" with "$S_{sup}$".

Signed and Sealed this
Third Day of September, 2024

*Katherine Kelly Vidal*
Katherine Kelly Vidal
*Director of the United States Patent and Trademark Office*